United States Patent [19]

Benesch

[11] Patent Number: 4,983,942

[45] Date of Patent: Jan. 8, 1991

[54] APPARATUS FOR LOCATING PASSIVE SHIM GUIDE RAILS IN MR MAGNETS

[75] Inventor: Jay F. Benesch, Gaithersburg, Md.

[73] Assignee: General Electric Company, Schenectady, N.Y.

[21] Appl. No.: 445,260

[22] Filed: Dec. 4, 1989

[51] Int. Cl.$^5$ .............................................. H01F 7/00
[52] U.S. Cl. ..................................... 335/301; 324/318
[58] Field of Search ................ 395/214, 211, 301, 304; 324/318, 319, 320

[56] References Cited

U.S. PATENT DOCUMENTS

| 4,698,611 | 10/1987 | Vermicyea | 335/301 X |
| 4,758,812 | 7/1988 | Forster et al. | 335/301 |
| 4,893,083 | 1/1990 | Overweg et al. | 335/301 X |

*Primary Examiner*—George Harris
*Attorney, Agent, or Firm*—Patrick R. Scanlon; James C. Davis, Jr.; Paul R. Webb, II

[57] ABSTRACT

An apparatus for installing shim guide rails in an MR magnet is provided including a plurality of beam members, one for every guide rail to be installed. A plurality of coaxial ring shaped members spaced apart from one another are joined together by the beam members. The beam members extend axially and are spaced circumferentially about the outer diameter of the ring shaped members forming a cylindrical open ended cage. Each of the beam members defines a plurality of radially extending spaced apart apertures. A plurality of ladder-like structures each of which is associated with a respective beam member is provided. Each of the ladder-like structures included two side pieces joined by a plurality of rungs extending between the side pieces. The rungs pass through the holes in the beam members with one of the side pieces situated inside the cylindrical cage and the other situated outside the cage. The guide rails are detachably mounted to a respective one of the side rails outside the cage, with the side of the guide rail to be mounted to the bore facing radially outwardly. Means for extending the rungs radially outwardly through the holes in the beam members is provided so that the guide rails are forced against the magnet bore.

4 Claims, 4 Drawing Sheets 4,983,942

APPARATUS FOR LOCATING PASSIVE SHIM GUIDE RAILS IN MR MAGNETS

CROSS REFERENCE TO RELATED APPLICATIONS

This application is related to copending application Ser. No. 445,303, entitled "Passive Shimming Assembly for MR Magnet" and assigned to the same assignee as the present invention.

BACKGROUND OF THE INVENTION

The present invention relates to an apparatus for precisely installing passive shim guide rails in the bore of an MR magnet.

Accurate placement of guide rails in MR magnets are important to help in precisely locating shim carrying drawers used to reduce field inhomogeneity and thereby permit a highly uniform magnetic field to be developed in the bore of the magnet. Magnet field inhomogeneity will distort the position information in the scan volume located in the magnet bore and degrade the image quality.

The guide rails, in addition to being spaced equally circumferentially apart to allow easy removal and insertion of the drawers preventing too much lateral motion, need to be correctly positioned in relation to the magnet. By having the rails installed in the same position in each magnet produced, the field map predicting the effect of a fixed size shim in each of the possible shim positions in the drawers can be used in all magnets of the same field strength and size.

It is an object of the present invention, to provide apparatus for installing guide rails in the bore of an MR magnet quickly and accurately.

SUMMARY OF THE INVENTION

In one aspect of the present invention, apparatus for installing shim guide rails in an MR magnet is provided including a plurality of beam members, one for every guide rail to be installed. A plurality of coaxial ring shaped members spaced apart from one another are joined together by the beam members. The beam members extend axially and are spaced circumferentially about the outer diameter of the ring shaped members forming a cylindrical open ended cage. Each of the beam members defines a plurality of radially extending spaced apart apertures. A plurality of ladder-like structures each of which is associated with a respective beam member is provided. Each of the ladder-like structures includes two side pieces joined by a plurality of rungs extending between the side pieces. The rungs pass through the holes in the beam members with one of the side pieces situated inside the cylindrical cage and the other situated outside the cage. The guide rails are detachably mounted to a respective one of the side rails outside the cage, with the side of the guide rail to be mounted to the bore facing radially outwardly. Means for extending the rungs radially outwardly through the holes in the beam members is provided so that the guide rails are forced against the magnet bore.

BRIEF DESCRIPTION OF THE DRAWING

The subject matter which is regarded as the invention is particularly pointed out and distinctly claimed in the concluding portion of the specification. The invention, however, both as to organization and method of practice, together with further objects and advantages thereof, may best be understood by reference to the following description taken in conjunction with the accompanying drawing figures in which:

DETAILED DESCRIPTION OF THE INVENTION

Figure 1:
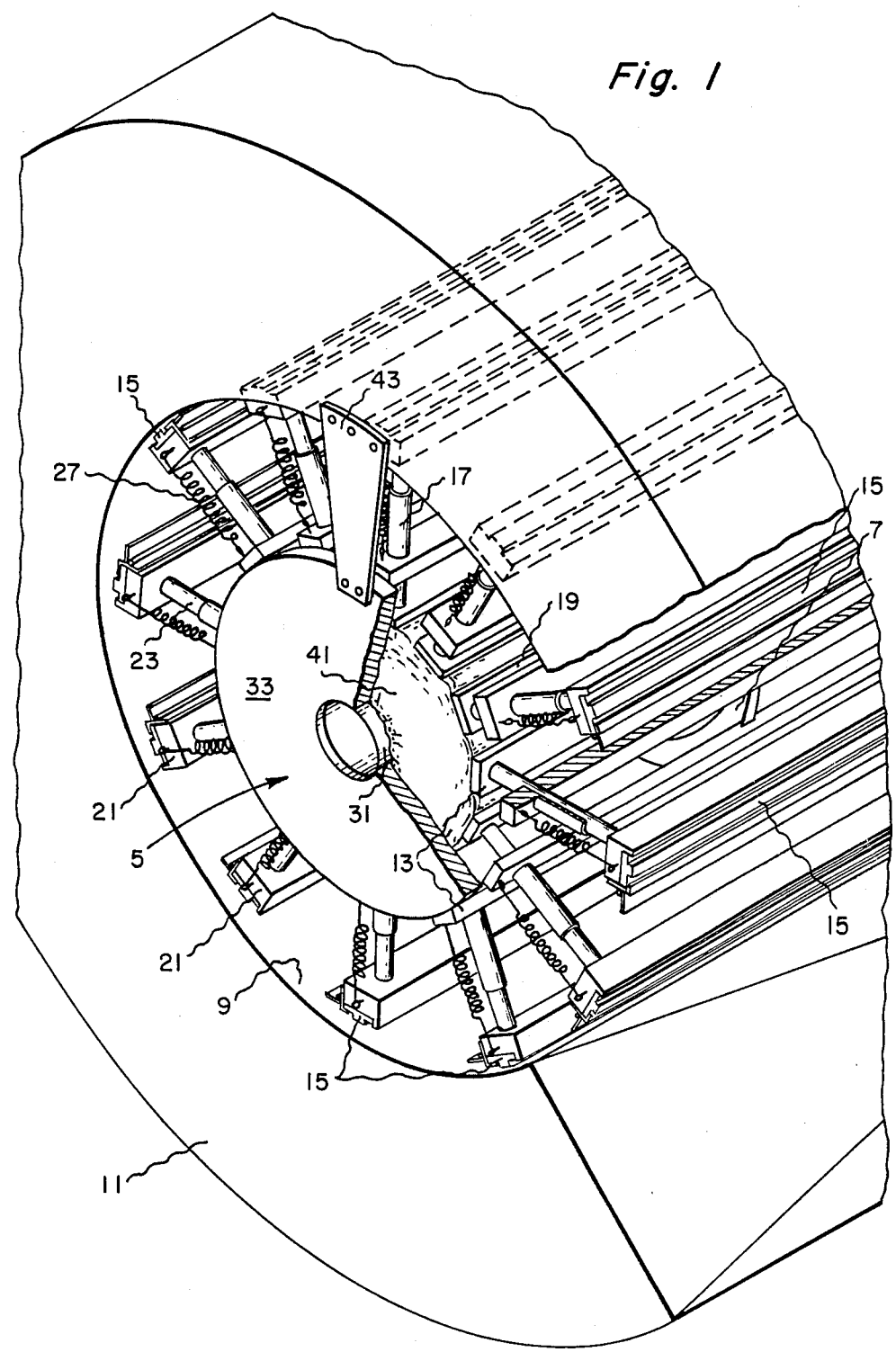
FIG. 1 is a partial isometric view partly in section of a MR magnet with the apparatus for locating shim guide rails situated in the magnet bore in accordance with the present invention.
Figure 2:
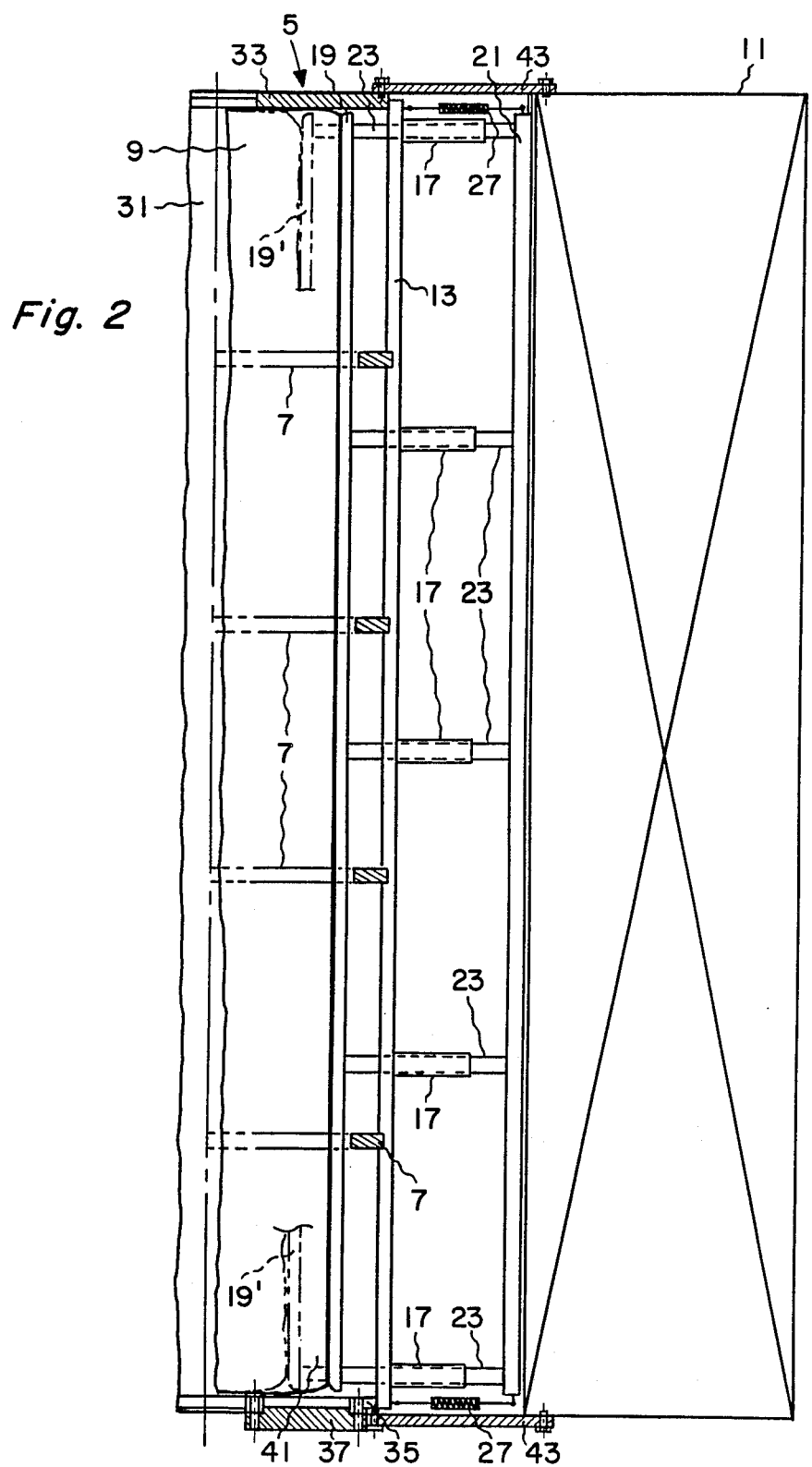
FIG. 2 is a sectional side view of a MR magnet and the apparatus for locating shim guide rails situated in the bore.
Figure 3:
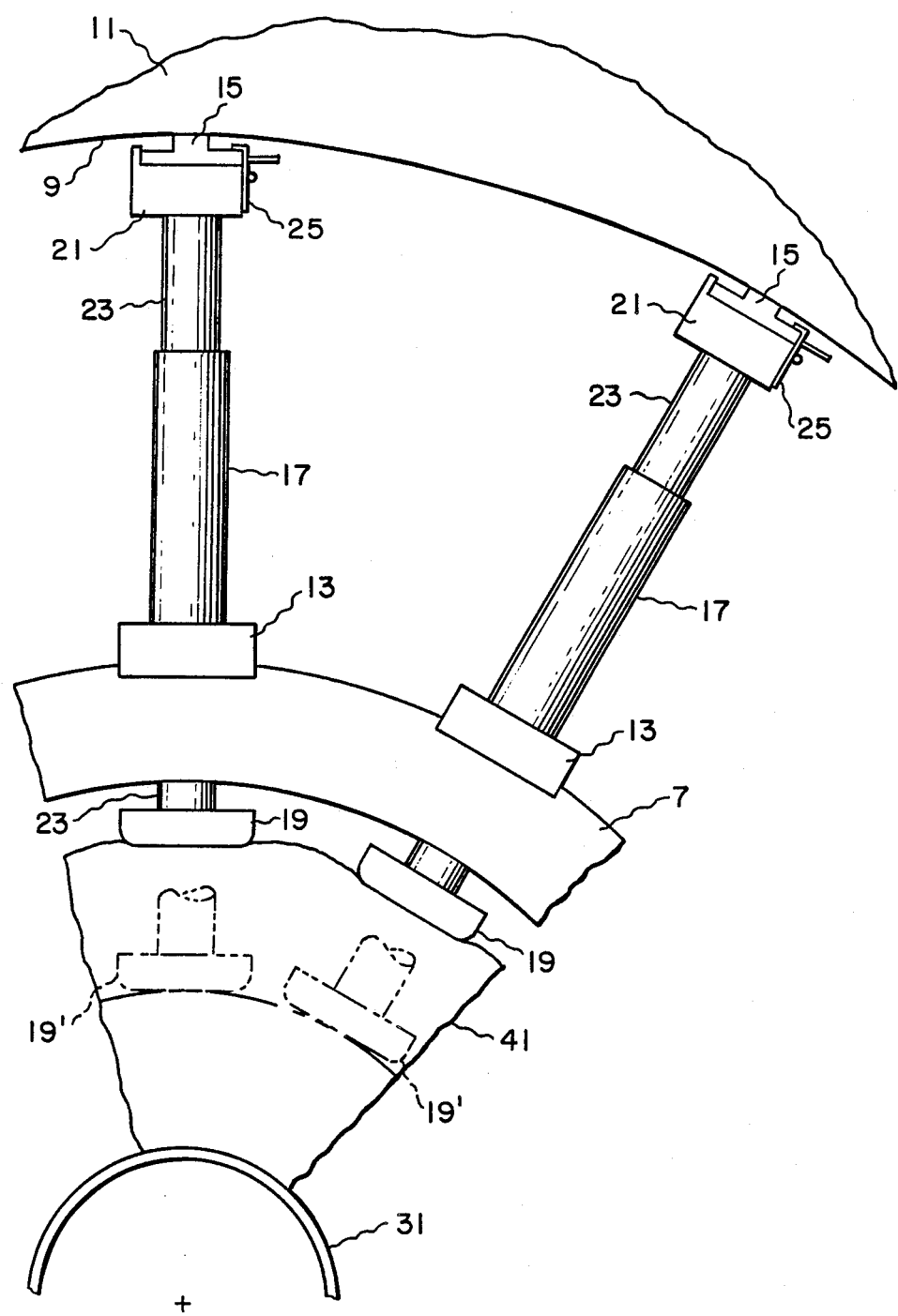
FIG. 3 is an enlarged end view showing a portion of the apparatus.

Referring now to the drawing and particularly FIGS. 1, 2, and 3 thereof an apparatus 5 in which all the structural members can be fabricated from steel is shown situated in the bore 9 of a magnetic resonance (MR) magnet 11. The apparatus has a plurality of coaxial rings 7 (four in the present embodiment) spaced apart from one another. A plurality of beams 13 (one for each rail 15 to be installed, of which there are twelve in the present embodiment) are circumferentially spaced apart around the outer perimeter of the rings 11, with the beams 13 extending in the axial direction forming a cylindrical cage opened at either end. The beams are each notched and secured to the rings such as by welding. Each beam 13 has a plurality of radially extending holes, four in the present embodiment, at the same axial distances. Aligned with the holes and extending radially outwardly from each of the holes is a sleeve 17 which is welded around the hole perimeter. Associated with each of the beams is a ladder-like structure with two side pieces 19 and 21 connected by rung 23. The rungs of each of the ladder-like structures has a close sliding fit within the sleeves 17. One side piece 19 connects the rungs inside the cage and the other side piece 21 connects the rungs outside the cage.

The outer side pieces 21 each have a channel facing radially outwardly for receiving a drawer rail 15. One side of the channel is formed by a spring hinge 25 which runs the full length of the side piece 21. The spring hinge when not retracted forms one side of the channel and extends over the ends of the rail holding the rail in the channel.

Springs 27 connect the outer side pieces 21 to the beams 13 on either end urging the outer side pieces radially inward. A cylindrical tube 31 extends along the axial centerline of the cage formed by the rings 7 and beams 13 and is held in place by two annular end plates 33 and 35 which are welded around the cylinder at their central opening and welded at their periphery to the beams 13. End plate 35 has a removable access ring 37 bolted in place.

An annular shaped air bag 41 extends around the cylindrical tube 31 and can be put in place through the access ring 37. The apparatus is oriented inside the bore of the magnet relative to a reference point on the magnet by supports located at either end. The supports are shown as support plates 43 can be held to the magnet by bolts extending into a reference circle of threaded bolt holes to properly orient the apparatus. A fork lift bar can be inserted in the cylindrical tube 31 to place the apparatus in the bore of the magnet and to remove it.

In operation, the apparatus 5 is positioned in the bore of the magnet and supported at either end by support plates 43 to assure correct orientation of the apparatus relative to the magnet. The ladder-like structures are held in their retract position as shown by the phantom lines indicated by reference numeral 19' in FIGS. 2 and 3 showing the position of the inner side pieces about the collapsed airbag. Guide rails 15 are positioned on each of the outer side pieces of the ladder-like structure and held in plastic by the full length spring hinge 25. Guide rails are not part of the apparatus and can be fabricated by machining reinforced plate laminates or can be formed to final dimension as glass-epoxy or glass-polyester pultrusions. Alternatively, stainless steel rails can be used. Adhesive or double sided tape is placed on the radially outward facing side of the guide rails. The air bag 41 is inflated acting against the inner side pieces urging the rungs 23 through the sleeves pushing the rails against the inner diameter sleeve of the magnet bore 9.

Figure 4:
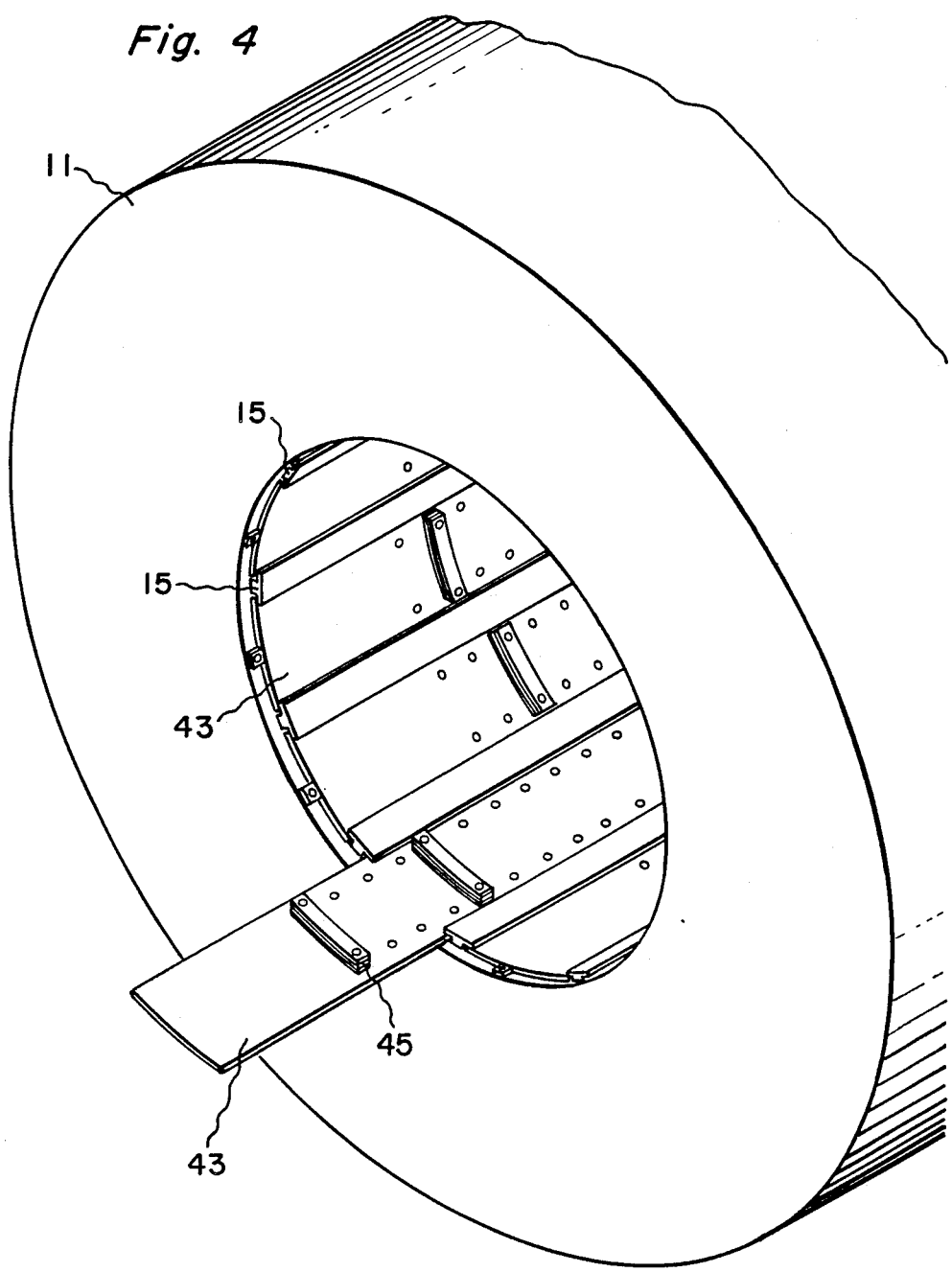
FIG. 4 is a partial isometric view of a magnet having shim guide rails installed and drawers mounted between the guide rails.

The air bag 41 is deflated and the spring hinge 25 opened to allow springs 27 to retract the ladder-like structures radially inwardly. The apparatus can be then removed from the magnet bore. In a magnet with a bore diameter of 85 centimeters, the travel inwardly and outwardly caused by the air bag inflation can be two inches, for example. The rails can be used to slidably hold drawers 43 each of which can hold a plurality of shim stacks 45 as shown in FIG. 4 or the rails can hold slidably axially shorter shim carriers which each have a single shim stack.

The foregoing has described apparatus for installing guide rails in the bore of an MR magnet quickly and accurately.

While the invention has been particularly shown and described with reference to an embodiment thereof, it will be understood by those skilled in the art that various changes in form and detail may be made without departing from the spirit and scope of the invention.

What is claimed is:

1. Apparatus for installing shim guide rails in an MR magnet comprising:
    a plurality of beam members, one for every guide rail to be installed;
    a plurality of coaxial ring shaped members spaced apart from one another, said beam members extending axially and spaced circumferentially about the outer diameter of said ring shaped members forming a cylindrical open ended cage, each of said beam members defining a plurality of radially extending spaced apart apertures;
    a plurality of ladder-like structures, each of said ladder-like structures associated with a respective one of said beam members, said ladder-like structures each including two side pieces joined by a plurality of rungs extending therebetween, said rungs passing through the holes in said beam members with one of said side pieces situated inside the cylindrical cage and the other situated outside said cage, said guide rails detachably mounted to a respective one of said side pieces outside said cage, the side of said guide rail to be mounted to the magnet bore facing radially outwardly; and
    means for extending said rungs radially outwardly through the holes in said beam members so that said guide rails are forced against said magnet bore.

2. The apparatus of claim 1 further comprising means for orienting said cage in the magnet bore.

3. The apparatus of claim 2 further comprising means for retracting said rungs through the holes in said beam members.

4. The apparatus of claim 3 wherein said means for extending said rung comprises an inflatable air bag situated centrally in said apparatus contacting said side pieces inside said cage.

* * * * *